United States Patent
Peev et al.

(10) Patent No.: US 11,206,018 B2
(45) Date of Patent: Dec. 21, 2021

(54) FLOATING SWITCH FOR SIGNAL COMMUTATION

(71) Applicant: Melexis Bulgaria Ltd., Sofia (BG)

(72) Inventors: Rumen Marinov Peev, Sofia (BG); Tsvetan Miroslavov Marinov, Sofia (BG); Filip Tsvetkov Filipov, Sofia (BG)

(73) Assignee: MELEXIS BULGARIA LTD, Sofia (BG)

( * ) Notice: Subject to any disclaimer, the term of this patent is extended or adjusted under 35 U.S.C. 154(b) by 0 days.

(21) Appl. No.: 17/230,420

(22) Filed: Apr. 14, 2021

(65) Prior Publication Data

US 2021/0328586 A1 Oct. 21, 2021

(30) Foreign Application Priority Data

Apr. 15, 2020 (EP) .................................... 20472004

(51) Int. Cl.
*H03K 17/00* (2006.01)
*H03K 17/689* (2006.01)
*H03K 17/687* (2006.01)

(52) U.S. Cl.
CPC ......... *H03K 17/689* (2013.01); *H03K 17/687* (2013.01); *H03K 2217/0081* (2013.01)

(58) Field of Classification Search
None
See application file for complete search history.

(56) References Cited

U.S. PATENT DOCUMENTS

| 4,170,740 A | 10/1979 | Pernyeszi | |
|---|---|---|---|
| 4,575,642 A * | 3/1986 | Hochreutiner | H03K 17/689 327/389 |
| 5,237,211 A * | 8/1993 | Tanaka | H03K 17/567 327/403 |
| 10,306,057 B1 * | 5/2019 | Sasso | H04M 3/527 |
| 2016/0248413 A1 | 8/2016 | Tabata et al. | |
| 2017/0117815 A1 | 4/2017 | Sato | |
| 2020/0186145 A1 | 6/2020 | Nagai et al. | |

FOREIGN PATENT DOCUMENTS

WO 2019054051 A1 3/2019

OTHER PUBLICATIONS

Extended European Search Report from corresponding EP Application No. 20472004.9, dated Sep. 4, 2020.

* cited by examiner

*Primary Examiner* — Tuan T Lam
(74) *Attorney, Agent, or Firm* — Workman Nydegger

(57) ABSTRACT

A solid state circuit includes a main and a floating circuit including: a first driver for generating a differential driver signal derived from a driver signal; a modulator configured for modulating a modulator signal with another signal to obtain a differential control signal; the floating circuit comprising: a floating power supply comprising at least one rectifier configured for generating a floating supply voltage (VDDF) and a floating ground voltage (VSSF) from the differential driver signal; a demodulator configured for demodulating the differential control signal and for passing the demodulated signal to an output switch; the output switch comprising a first output node and a second output node and at least one transistor configured for opening or closing an electrical path under control of the demodulated signal.

15 Claims, 4 Drawing Sheets

US 11,206,018 B2

FLOATING SWITCH FOR SIGNAL COMMUTATION

FIELD OF THE INVENTION

The invention relates to the field of signal commutation. More specifically it relates to a solid state circuit providing an output with electrical isolation from the main power supply.

BACKGROUND OF THE INVENTION

Electrically-actuated and magnetically-actuated electric switches are used in many applications. In some applications, the switch output needs to be electrically isolated from the rest of the system. This applies for instance when the electrical system to be switched or controlled works in a different voltage domain, e.g. at higher voltages.

A common approach to solve the problem is to use a reed-switch, or reed-relay. The reed-switch provides electrical isolation. In such a relay, ferromagnetic flexible metal contacts are actuated by a magnet (or electromagnet). Usually, a reed switch is normally open (non conducting when no field is applied). When a magnetic field is applied, the contacts close and the switch is conducting. A major drawback of reed switches is that they contain moving parts, which affects the reliability over lifetime of such a switch. Another major drawback of reed switches is the aging (oxidation) of the contacts. Such a switch could be kept under vacuum or in inert gas. Usually the size of the reed-switch is relatively big. Another disadvantage is that the reed switches are relatively slow.

Hall switches and electronic switches provide a robust solid state alternative to mechanically actuated switches and do not require moving parts. However, the conventional Hall switches which comprise sensing elements, processing electronics, and output control do not provide an electrically isolated output.

There is therefore a need for a device with a good reliability and with an electrical isolation of the output.

SUMMARY OF THE INVENTION

It is an object of embodiments of the present invention to provide a solid state circuit which enables signal commutation and which provides an output with electrical isolation from the main power supply.

The above objective is accomplished by a method and device according to the present invention.

Embodiments of the present invention relate to a solid state circuit comprising a main circuit and a floating circuit.

The main circuit comprises:
 a first driver configured for receiving a driver signal on a driver input and for generating a differential driver signal derived from the driver signal on a differential driver output,
 a modulator configured for modulating a modulator signal from a modulator input with a signal from a control input to obtain a differential control signal on a differential modulator output.

The floating circuit comprises the following building blocks:
 a floating power supply comprising at least one rectifier configured for generating a floating supply voltage (VDDF) and a floating ground voltage (VSSF) from the differential driver signal,
 a demodulator comprising a differential control input for receiving the differential control signal, and configured for demodulating the differential control signal and comprising a control output for passing the demodulated signal to an output switch,
 the output switch comprising a first output node and a second output node and at least one transistor configured for opening or closing an electrical path under control of the demodulated signal.

Thus, an output switch can be obtained which is galvanically isolated from the control input. This is achieved by not only providing a floating domain, but also by providing a control circuit which allows to transfer the control signal for the output switch to the floating domain. This control circuit comprises the modulator and demodulator.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
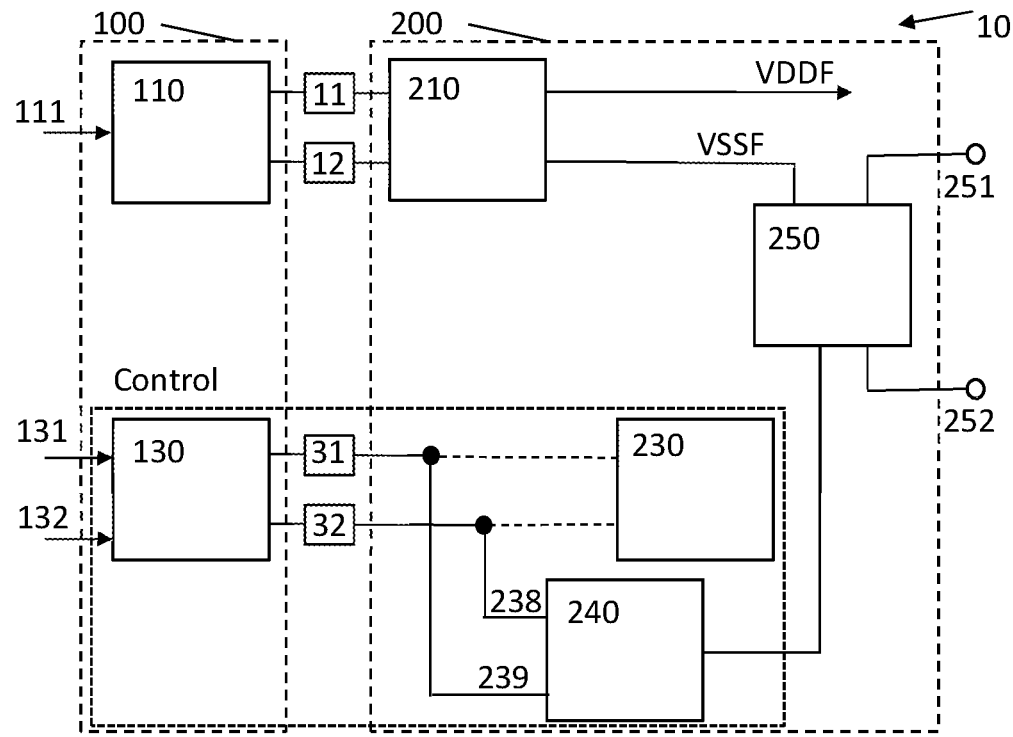
FIG. 1 shows a schematic drawing of a solid state circuit in accordance with embodiments of the present invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention relate to a solid state circuit 10 comprising a main circuit 100 and a floating circuit 200. A schematic drawing of an exemplary embodiment of such a circuit is shown in FIG. 1.

The main circuit comprises a first driver 110 configured for receiving a driver signal on a driver input 111 and for generating a differential driver signal derived from the driver signal on a differential driver output. The driver signal may for example be an oscillating signal. The driving signal can for example be obtained from an on-chip oscillator (e.g. RC oscillator), from a discrete crystal resonator, or from an external clock signal. Driving signal can have different shapes. It can for example be a sine wave or it can be a square wave. The driving signal can have a fixed frequency. The first driver may be a differential clock driver which has an input connected to a first clock signal and two complementary outputs.

The main circuit, moreover, comprises a modulator 130 configured for modulating a modulator signal from a modulator input 131 with a signal from a control input 132 to obtain a differential control signal on a differential modulator output. The input signal for the modulator input may for example be a clock signal. Different variants of modulations may be applied such as Binary Phase Shift Keying (BPSK), amplitude modulation, frequency modulation, phase modulation, mixed modulation, etc.

The solid state circuit 10 also comprises a floating circuit 200. This floating circuit 200 comprises a floating power supply comprising at least one rectifier 210 configured for generating a floating supply voltage (VDDF) and a floating ground voltage (VSSF) from the differential driver signal.

The solid state circuit 10, moreover, comprises a demodulator 240. This demodulator comprises a differential control input for receiving the differential control signal, and configured for demodulating the signal and comprising a control output for passing the demodulated signal to an output switch 250.

The output switch 250 comprises a first output node 251 and a second output node 252 and at least one transistor configured for opening or closing an electrical path under control of the demodulated signal. In embodiments of the present invention the output switch 150 is configured for commutating both output nodes.

It is an advantage of embodiments of the present invention that the output switch is galvanically isolated from the control input. This is achieved by building a power supply in the floating domain (the rectifier) which is galvanically isolated from the main circuit and by modulating the control signal to obtain a differential signal and demodulating the differential signal in the floating domain wherein the modulator and demodulator are galvanically isolated.

Thus, in embodiments of the present invention an electronic switch may be obtained which behaves as an electromechanical relay. The first output node and the second output node may be interchangeable. It is advantageous that the switching potentials on these output nodes are not electrically connected to the main power supply voltage. In embodiments of the present invention the output nodes may be connected to any positive or negative potential. The limitation is the breakdown voltage of the transistor(s) used for the output switch and the ESD protection of the IC.

The driver signal for the first driver may be a clock signal or an oscillating signal with a frequency ranging between 0.01 and 100 MHz such as for example between 1 and 10 MHz. The input signal for the modulator input may for example be a clock signal or an oscillating signal with a frequency ranging between 0.01 and 100 MHz such as for example between 1 and 10 MHz. The control signal may for example have a maximum frequency of up to 1 MHz or even up to 10 MHz.

In embodiments of the present invention the main circuit comprises power connections for powering the main circuit using a main power supply (VDDA, VSSA).

In embodiments of the present invention the building blocks of the floating circuit 200 may be powered by the floating power supply.

In embodiments of the present invention a first pair of coupling elements 11, 12 may be connecting the differential driver output of the first driver 110 with a pair of inputs of the rectifier 210. The pair of coupling elements is configured for passing the differential driver signal to the rectifier and for providing a galvanic isolation between the rectifier 210 and the first driver 110.

Similarly, in embodiments of the present invention a second pair of coupling elements 31, 32 may be connecting the differential modulator output with the demodulator differential control input. This pair of coupling elements is configured for passing the differential control signal to the demodulator and for providing galvanic isolation between the modulator 130 and the demodulator 240.

As discussed earlier the output switch 250 comprises a first output node 251 and a second output node 252 and at least one transistor configured for opening or closing an electrical path under control of the demodulated signal.

Figure 2:
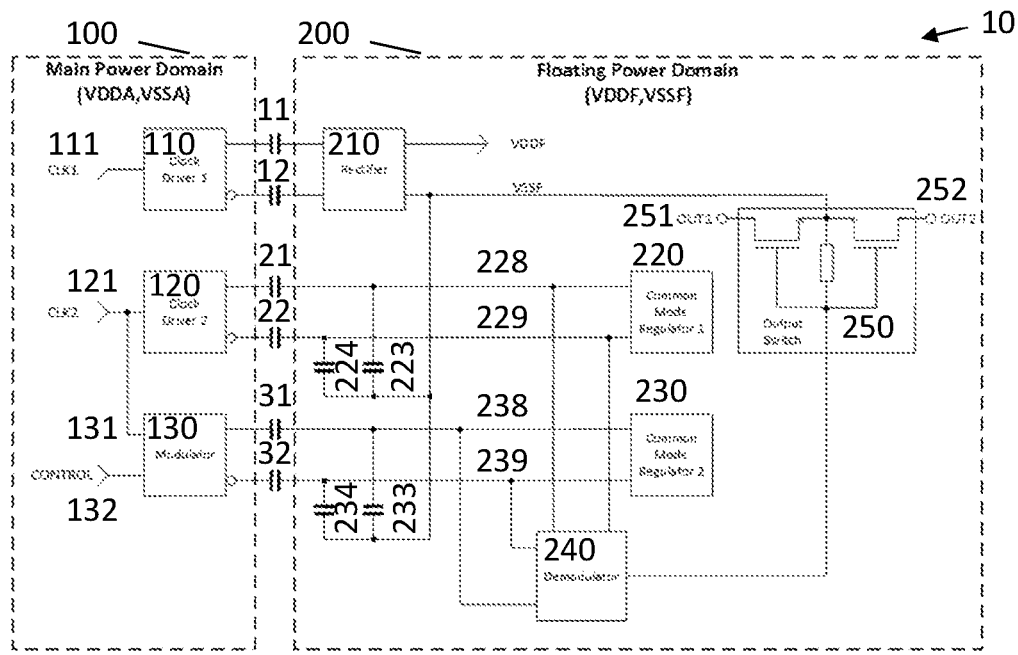
FIG. 2 shows a schematic drawing of a solid state circuit, which additionally comprises a driver for generating a reference signal for the demodulator, in accordance with embodiments of the present invention.
Figure 3:
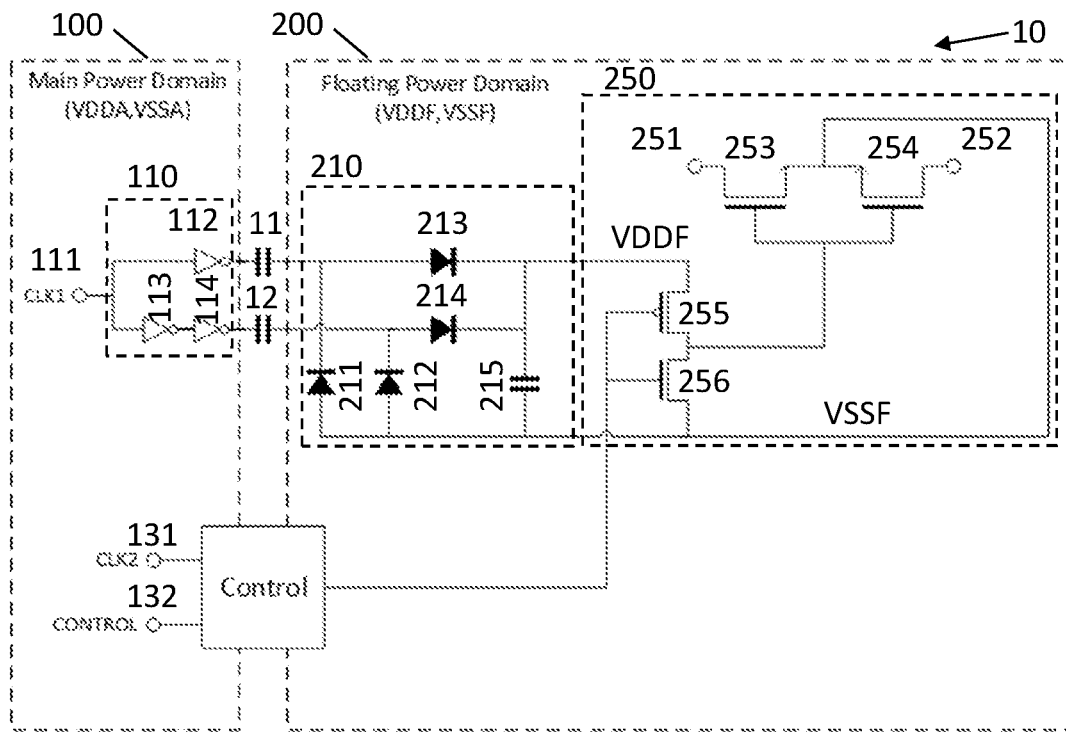
FIG. 3 shows implementation details of a first driver, a rectifier, and an output switch of a solid state circuit, in accordance with embodiments of the present invention.

In some embodiments this electrical path may be between the first output node 251 and the second output node 252. Examples thereof are illustrated in FIG. 2 and FIG. 3.

Figure 6:
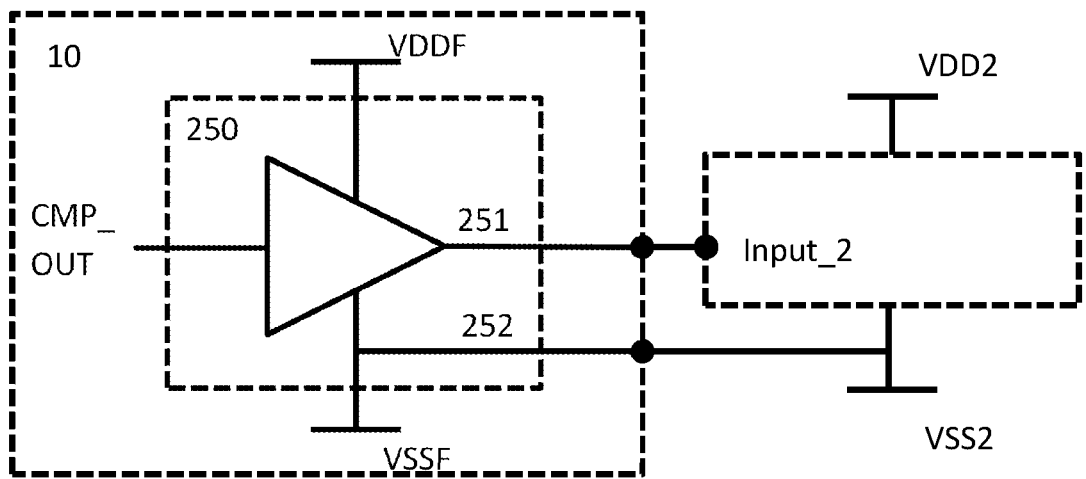
FIG. 6 shows a schematic drawing of an output driver comprising an amplifier controlled by the demodulated signal, in accordance with embodiments of the present invention.
Figure 7:
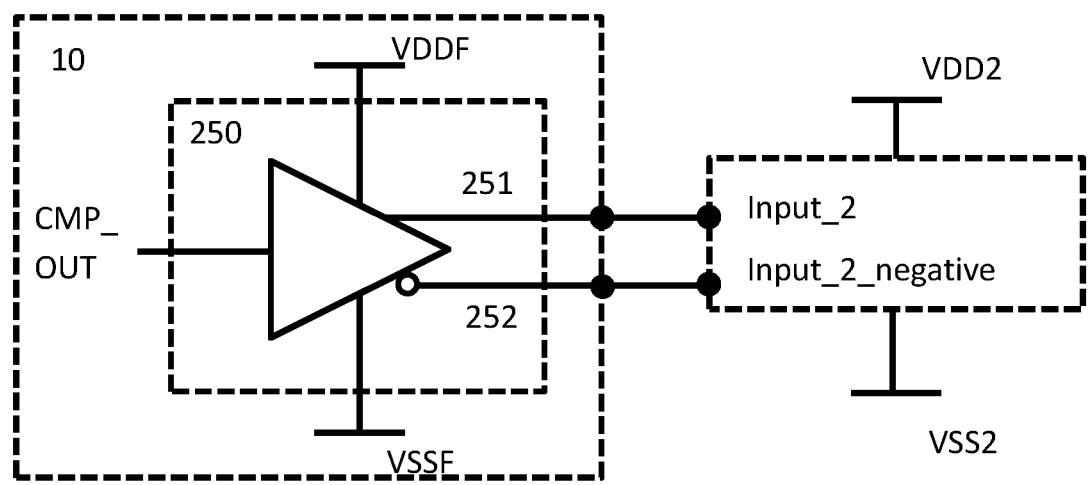
FIG. 7 shows a schematic drawing of a complementary push-pull output driver.
Figure 8:
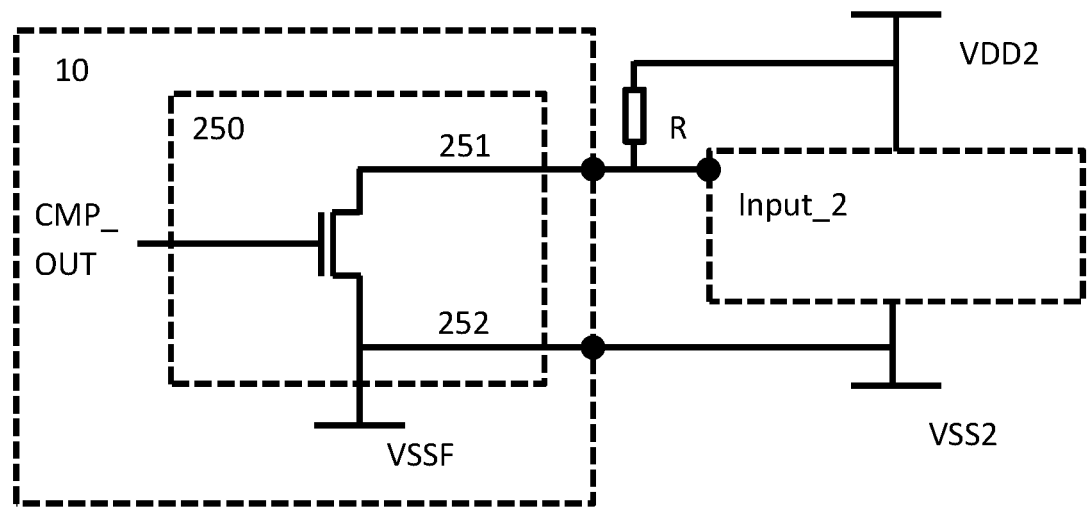
FIG. 8 shows a schematic drawing of an output driver comprising an open drain MOSFET, in accordance with embodiments of the present invention.

The electrical path which is switched, however, not necessarily needs to be between the first output node 251 and the second output node 252. Examples thereof are illustrated in FIG. 6 to FIG. 8.

The output switch 250 may for example be a push-pull driver, a buffer, or an amplifier. In the example illustrated in FIG. 6 the output switch 250 is an amplifier controlled by the demodulated signal CMP_OUT. The main circuit (not shown in this figure) may for example be powered by a supply VSSA, VDDA. The floating circuit is powered by a supply VDDF, VSSF which is galvanically isolated from the supply of the main circuit. In this example a second load or electronic system is switched using a signal between the first output node 251 and the second output node 252. The load or electronic system may be powered using a supply VDD2, VSS2. The first output node 251 may for example be connected with an input (e.g. Input_2) of the load or electronic system and the second output node may be connected with the ground VSS2. It is an advantage of embodiments of the present invention that the load or electronic system, with its own supply VDD2, and ground VSS2 is galvanically isolated from the supply of the main circuit (VSSA, VDDA). FIG. 7 shows a schematic drawing of a complementary push-pull output driver.

In embodiments of the present invention the output switch 250 may be a single transistor. In the exemplary embodiment of the present invention illustrated in FIG. 8 the output switch 250 is an open drain MOSFET (NMOS shown in FIG. 8). In other embodiments a PMOS can be used. In the example of FIG. 8 the gate is controlled by the demodulated signal CMP_OUT and the source and the drain are the first output node 251 and the second output node 252.

In embodiments of the present invention the output switch 250 may comprise one or more MOSFET, JFET, BJT, IGBT or any other type of transistors.

In embodiments of the present invention the used fabrication process may be CMOS, BiCMOS, SOI, BCD, SiC, GaN or any other suitable process.

In embodiments of the present invention a transfer printing process may be used to implement one or more solid state circuit elements. Thus, one or more solid state circuits of the present invention can be transferred and connected to another substrate/circuit.

The floating circuit 200 may comprise a first common mode voltage regulator 230 configured for setting a common mode voltage of the differential control signal to a predefined value to obtain a regulated differential control signal. An example thereof is shown in the schematic drawings of FIG. 1, FIG. 2, and FIG. 4. The common mode voltage regulator is electrically connected with the first input 238 and with the second input 239 of the demodulator 240 (see for example the dashed lines connected with the common mode voltage regulator in FIG. 1). In embodiments of the present invention a second pair of coupling elements 31,32 is connecting the differential modulator output with the first common mode voltage regulator 230. This pair of coupling elements is configured for passing the differential control signal to the first common mode voltage regulator 230 and for providing a galvanic isolation between the common mode voltage regulator 230 and the modulator 130.

Figure 4:
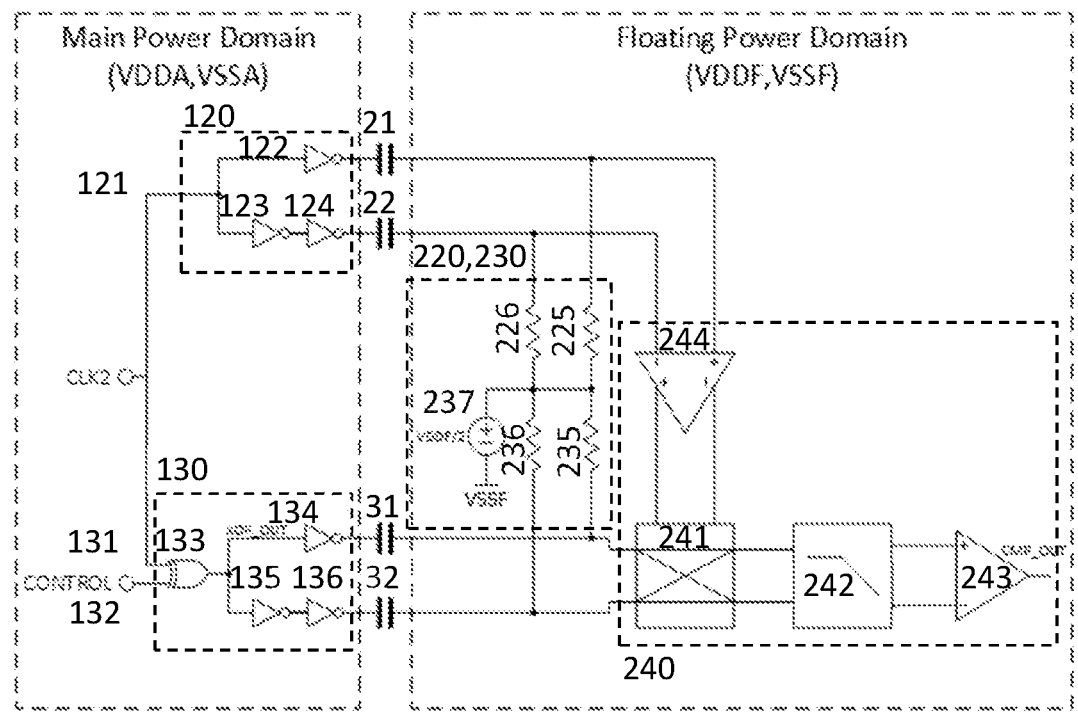
FIG. 4 shows implementation details of a second driver, a modulator, and a demodulator, of a solid state circuit in accordance with embodiments of the present invention.

The main circuit 100 may, moreover, comprise a second driver 120 for generating a reference signal for the demodulator. An example thereof is shown in FIG. 2, and FIG. 4. The second driver 120 comprises a driver input 121 which is configured for receiving the modulator signal (which may be a clock signal) or a signal derived therefrom. The second driver is configured for generating a differential reference signal from the signal at the driver input 121 on its differential reference output. The differential reference clock is generated based on the incoming signal which may be the modulator signal or a signal derived therefrom. In such an embodiment the demodulator 240 comprises a differential reference input 241 for receiving the differential reference signal and for using it as a reference signal for demodulating the differential control signal.

Alternatively, in embodiments of the present invention the differential driver signal from the first driver may be used as a reference signal for demodulating the differential control signal. In that case the differential reference input 241 of the demodulator may be connected with the first pair of coupling elements 11, 12.

The output of the second driver 120 may be connected with the demodulator 240 by means of a third pair of coupling elements 21, 22. The third pair of coupling elements is configured for passing the differential reference signal from the second driver 120 to the demodulator 240 and for providing a galvanic isolation between the demodulator and the second driver 120. The second driver may be a differential clock driver which has an input connected to a second clock signal and two complementary outputs. This second clock signal may be connected with the driver input of the modulator.

In embodiments of the present invention the coupling elements of the first pair, and/or second pair and/or third pair may be capacitive coupling pairs. In embodiments of the present invention also other coupling elements may be used such as for example inductive coupling elements.

The floating circuit 100 may, moreover, comprise a common mode voltage regulator 220 configured for setting a common mode voltage of the differential reference signal to a predefined value to obtain a regulated differential reference signal.

In embodiments of the present invention the common mode voltage regulator for the differential clock signal from the second clock driver may be the same as the first common mode voltage regulator, or it may be an additional common mode voltage regulator. In case one common mode voltage regulator is used this common mode voltage regulator may have four outputs.

In embodiments of the present invention the floating circuit 200 may comprise a first capacitor 233 connected between a first input 238 of the demodulator 240 and the floating ground voltage (VSSF) and a second capacitor 234 connected between a second input 239 of the demodulator 240 and the floating ground voltage (VSSF). An Example thereof is illustrated in FIG. 2. These first and second capacitors serve as an attenuation pair.

In embodiments of the present invention the floating circuit 200 may moreover comprise a third capacitor 223 connected between a first input 228 of the common mode voltage regulator 220 and the floating ground voltage (VSSF) and a fourth capacitor 224 connected between a second input 229 of the common mode voltage regulator 220 and the floating ground voltage (VSSF). An example thereof is illustrated in FIG. 2. These third and fourth capacitors serve as an attenuation pair.

In embodiments of the present invention the output switch 250 may comprise two transistors 253, 254 in a back to back configuration. In embodiments of the present invention the two transistors in the back-to-back configuration are symmetrical. An example of such transistors in a back to back configuration is shown in FIG. 2, and FIG. 3.

The different components of the solid state circuit in FIG. 2 have already been discussed and are here summarized for completeness. The schematic drawing in FIG. 2 shows the first driver 110 of which the differential output is capacitively coupled to the rectifier 210, the second driver 120 of which the output is capacitively coupled to the demodulator 240 for passing the reference signal, the modulator 130 of which the differential output is capacitively coupled to the demodulator 240. A common mode voltage regulator 220 is capacitively coupled with the differential output of the second driver 120 and another common mode voltage regulator 230 is capacitively coupled with the differential output of the modulator 130. The output of the demodulator is connected with the output switch 250 for controlling the output switch 250. The vertical capacitors 223, 224, 233, 234 serve as attenuation pairs.

In embodiments of the present invention the output switch 250 additionally may comprise an output transistor driver.

A solid state circuit 10 according to embodiments of the present invention additionally may comprise a second rectifier configured for generating a floating supply voltage (VDDF2) related to the floating ground voltage (VSSF) from the differential driver signal for powering the output switch 250. It is thereby an advantage that the gate driving voltage of the output switch can be increased and the on resistance Rdson of the output switch can be decreased. The second floating supply voltage may specifically be used of powering the output switch.

A fourth pair of coupling elements may be connecting the differential driver output of the first driver 110 with a pair of inputs of the second rectifier. The fourth pair is configured for passing the differential driver signal to the second rectifier and for providing a galvanic isolation between the second rectifier and the first driver.

In embodiments of the present invention a rectifier may be supplied by the second clock driver 120 through the third pair of coupling elements 21, 22 (which then serves as first pair of coupling elements) or even by the modulator 130 itself through the second pair of coupling elements 31 and 32 (which then servers as first pair of coupling elements). In this case, the second driver 120 or the modulator 130 are functioning as first driver.

In embodiments of the present invention the demodulator 240 may comprise a low-pass filter 242 for filtering the demodulated signal. An example thereof is given in FIG. 4.

In embodiments of the present invention the demodulator 240 may comprise a detector 243. This detector may for example be a comparator. An example of such a detector is given in FIG. 4. The function of the detector is to generate a clean control signal that has sharp transitions and that is scaled to VDDF (see for example LP_OUT vs. CMP_OUT signals in FIG. 5).

In embodiments of the present invention the solid state circuit may comprise a magnetic sensor connected with the control input 132 of the modulator. The magnetic sensor may for example be a Hall sensor or magneto-resistive sensor (xMR). The magnetic sensor can detect the presence of a magnetic field and hence the signal of the control input can be changed by means of a static or a alternating magnetic field (e.g. by moving a magnet or by applying a current through a coil.

FIG. 3 shows an architecture drawing of an exemplary solid state circuit in accordance with embodiments of the present invention. Both the analog domain and the floating domain are shown. In this example the output transistors of the output switch 250 are configured in a back to back configuration and a differential charge pump is used as rectifier 210. The first driver 110 has a driver input 111 and two branches. A first branch comprises a first inverter 112 and a second branch comprises a series connection of two invertors 123, 124. A clock CLK may be connected to the driver input 111. The differential driver output is capacitively 11, 12 coupled to the rectifier 210. The control circuit is represented by the square with as inputs a modulator input 131 (CLK_C) and a control input 132 (DIN). The output of the control circuit is connected with the output switch. The control signal is transferred continuously. The control circuit will be discussed in more detail when discussing FIG. 4.

In embodiments of the present invention the rectifier may comprise diodes and/or transistors controlled in an appropriate way. In this example the rectifier is a differential charge pump. It comprises a first diode 211, a second diode 212 a third diode 213, a fourth diode 214, and a capacitor 215. The anodes of the first diode 211, the second diode 212 and a first terminal of the capacitor 215 are connected together. The cathode of the first diode 211 is connected with the first coupling element 11 and with the anode of the third diode 213. The cathode of the second diode 212 is connected with the second coupling element 12 and with the anode of the fourth diode 214. The cathode of the third diode, and the cathode of the fourth diode and a second terminal of the capacitor 215 are connected together. In such embodiments, during operation, the floating supply voltage (VDDF) will be present at the cathodes of the third and fourth diode, and the floating ground voltage (VSSF) will be present on the cathodes of the first and second diode.

The differential charge pump is used in order to avoid the charge pump current to flow through the output. The current may for example flow along the path of the first capacitor 11, the third diode 213, the capacitor 215, the second diode 212, and the second capacitor 12. Basically when one capacitor is pushing charge the other one is pulling it. The storage capacitor 215 may be bigger than the coupling capacitors 11 and 12. This way fluctuations in the floating supply voltage (VDDF) can be reduced. The storage capacitor 215 can be integrated in the circuit or can be an external component.

FIG. 4 shows a possible implementation of the control circuit comprising a modulator 130 and demodulator 140 in accordance with embodiments of the present invention. In the analog domain the control circuit comprises a second driver 120 and a modulator 130.

The second driver 120 has a driver input 121 and two branches. A first branch comprises a first inverter 122 and a second branch comprises a series connection of two inventors 123, 124. A clock CLK_C may be connected to the driver input 121. The differential driver output is capacitively (first capacitor 21, second capacitor 22) coupled to the common mode voltage regulator 220 and to the demodulator 240 in the floating domain.

In this example the common mode voltage regulator 220, 230 comprises a voltage source 237 which, in conjunction with resistors 225, 226, 236, and 235 are used to set the common mode of the difference paths. The voltage source provides a voltage VDDF/2 such as to set the common mode voltage at a mid-point of the floating voltage. One terminal of the voltage source is connected with VSSF and the other terminal is connected with the resistors 225, 226, 236, and 235. The resistors 225, 226 are connected with the differential input of the comparator 244. The resistors 235, 236 are connected with the differential input of the demodulator 240.

In this example the modulator 130 comprises a XOR gate with two inputs a first input is the modulator input 131 (CLK_C) and a second input is the control input 132 (DIN). In this example the same clock CLK_C is used for the driver input 121 as for the modulator input 131. In embodiments of the present invention the signal on the control input is a digital signal DIN. The signal on the control input DIN changes the phase of the clock signal CLK_C at the output of the XOR gate. The output of the XOR gate is connected with two branches. A first branch comprises a first inverter 134 and a second branch comprises a series connection of two invertors 135, 136. Thus a differential signal can be obtained at the output of the two branches. The modulator 130 is capacitively coupled (first capacitor 31, second capacitor 32) to a first common mode regulator 230 and to the demodulator 240 in the floating domain. The demodulator 240 comprises a low-pass filter 242 for filtering the ripples from the demodulated signal and a comparator 243 to generate a clean control signal. So the demodulator looks whether the differential signal of the upper branch is in phase (DIN=0) or 180° out of phase (DIN=1) with respect to the lower branch, and the comparator 243 outputs a signal referred to VSSF. The comparator after the low-pass filter is zero cross and detects if its differential input signal is bigger or lower than 0.

Thus, in embodiments of the present invention not only a floating domain is created, but also the control signal for the output switch is transferred to the floating domain.

Figure 5:
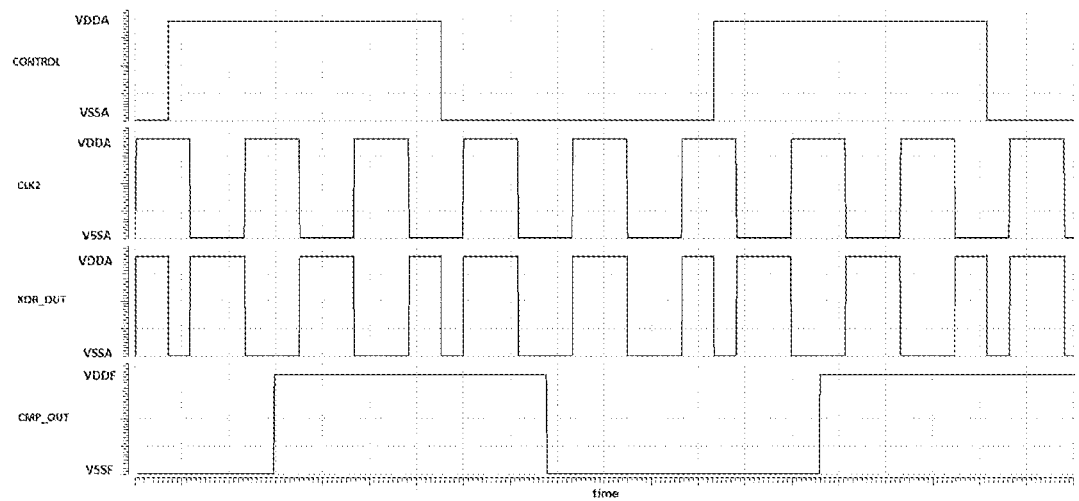
FIG. 5 shows a plot of different signals in the circuit of FIG. 4, in accordance with embodiments of the present invention.

A plot of different signals in the circuit of FIG. 4 is shown in the graph FIG. 5. From top to bottom the following signals are shown:

CONTROL: this is the digital input signal at the control input 132 of the modulator;

CLK2: this is a clock signal at the driver input 121 and at the modulator input 131;

XOR_OUT: this is the output of the XOR gate 133;

CMP_OUT: this is the signal at the output of the comparator 243.

Note that the demodulated control signal (CMP_OUT) is referred to the floating domain (VSSF and VDDF), whereas the control signal (CONTROL) is referred to VSSA. The switching delay between CONTROL and CMP_OUT is due to filtering in the demodulator stage.

A solid state circuit according to embodiments of the present invention may comprise ESD protection means. The ESD protection means may for example comprise a full bridge rectifier and clamping structure connected to the rectifier.

The control signal may be corrupted by direct power injection (DPI). This may be reduced by providing a control circuit as illustrated in FIG. 2. By providing the vertical capacitors 223, 224, 233, 234 the disturbance is coupled differentially to the signal. By doing so the common mode of the signal is increasing as VSSF is increasing which prevents the diodes from conducting. The vertical capacitors 223, 224, 233, and 234 may have the same capacitance C1. This capacitance C1 is several times bigger than the capacitance C of the coupling capacitors 21, 22, 31 and 32.

In embodiments of the present invention more than one floating switches 250 may be controlled by the solid state circuit. This may for example be used to obtain a Single Pole Double Throw (SPDT) switch configuration. Also other possible configurations may be obtained by adding more than one output switch.

In embodiments of the present invention a plurality of floating circuits 200 may be present with a common main circuit 100. In embodiments of the present invention one or more demodulated signals may be generated and embodiments of the present invention may comprise one or more floating power supplies.

In embodiments of the present invention more than one floating switches 250 could be implemented in one or more floating circuits 200, supplied by one or more floating power supplies in one and the same solid state circuit. This may for example be used to obtain SPDT, DPST, DPDT or any other suitable switch configuration.

A solid state circuit according to embodiments of the present invention allows the transmission of a control signal (which may for example be a data signal) to a floating switch (which may for example be an output driver) using modulation by usage of separate differential coupling pairs for data and power transfer into a floating domain. Capacitive attenuation may be used for improved EMC immunity. A solid state circuit according to embodiments of the present invention supports reliably transmitting a control signal to a floating domain together with generating a floating supply, which are not disturbed by a floating switch output voltage change and by EMC disturbances.

It is an advantage of embodiments of the present invention that they can be implemented in standard CMOS technology without the need for opto-couplers, or transformers, etc.

In embodiments of the present invention the main circuit and floating circuit may be galvanically isolated using a SOI substrate and/or deep trench isolation.

The invention claimed is:

1. A solid state circuit comprising a main circuit and a floating circuit, the main circuit comprising:
a first driver configured for receiving a driver signal on a driver input and for generating a differential driver signal derived from the driver signal on a differential driver output;
a modulator configured for modulating a modulator signal from a modulator input with a signal from a control input to obtain a differential control signal on a differential modulator output;
the floating circuit galvanically isolated from the main circuit and comprising the following building blocks:

a floating power supply comprising at least one rectifier configured for generating a floating supply voltage (VDDF) and a floating ground voltage (VSSF) from the differential driver signal;

a demodulator comprising a differential control input for receiving the differential control signal, and configured for demodulating the signal and comprising a control output for passing the demodulated signal to an output switch;

the output switch comprising a first output node and a second output node and at least one transistor configured for opening or closing an electrical path under control of the demodulated signal.

2. The solid state circuit according to claim 1, the main circuit, moreover, comprising a second driver configured for receiving the modulator signal or a signal derived therefrom on a driver input and for generating a differential reference signal from the signal at the driver input on a differential reference output, wherein the demodulator comprises a differential reference input for receiving the differential reference signal and for using it as a reference signal for demodulating the differential control signal.

3. The solid state circuit according to claim 1 wherein the demodulator comprises a differential reference input for receiving the differential driving signal from the first driver and for using it as a reference signal for demodulating the differential control signal.

4. The solid state circuit according to claim 1, the solid state circuit comprising a first pair of coupling elements connecting the differential driver output of the first driver with a pair of inputs of a rectifier, the first pair of coupling elements configured for passing the differential driver signal to the rectifier and for providing a galvanic isolation between the rectifier and the first driver and a second pair of coupling elements connecting the differential modulator output with the demodulator differential control input, and configured for passing the differential control signal to the demodulator and for providing galvanic isolation between the modulator and the demodulator.

5. The solid state circuit according to claim 2, the solid state circuit comprising a third pair of coupling elements connecting the output of the second driver with the demodulator and configured for passing the differential reference signal from the second driver to the demodulator and for providing a galvanic isolation between the demodulator and the second driver.

6. The solid state circuit according to claim 1, wherein the floating circuit moreover comprises a first capacitor connected between a first input of the demodulator and the floating ground voltage (VSSF) and a second capacitor connected between a second input of the demodulator and the floating ground voltage (VSSF).

7. The solid state circuit according to claim 1, wherein the floating circuit comprises a common mode voltage regulator configured for setting a common mode voltage of the differential control signal, and/or of the differential reference signal.

8. The solid state circuit according to claim 2, wherein the floating circuit moreover comprises a third capacitor connected between a first node of the differential reference input and the floating ground voltage (VSSF) and a fourth capacitor connected between a second node of the differential reference input and the floating ground voltage (V SF).

9. The solid state circuit according to claim 1, wherein the output switch comprises two transistors in a back to back configuration.

10. The solid state circuit according to claim 1, wherein the output switch additionally comprises an output transistor driver.

11. The solid state circuit according to claim 1, wherein the floating power supply additionally comprises a second rectifier configured for generating a second floating supply voltage (VDDF2) related to the floating ground voltage (VSSF) from a third differential driver signal for powering the output switch.

12. The solid state circuit according to claim 1, wherein the demodulator comprises a low-pass filter for filtering the demodulated signal.

13. The solid state circuit according to claim 2, wherein the differential reference input of the demodulator additionally comprises a clock signal regenerating circuit.

14. The solid state circuit according to claim 1, the solid state circuit comprising a magnetic sensor connected with the control input of the modulator.

15. The solid state circuit according to claim 1, the solid state circuit comprising a plurality of output switches which are configured for opening or closing an electrical path under control of the at least one demodulated signal and the plurality of the output switches are supplied by the at least one floating power supply.

* * * * *